United States Patent [19]

Neuville

[11] Patent Number: 5,846,613
[45] Date of Patent: Dec. 8, 1998

[54] METHOD FOR DEPOSITING A HARD PROTECTIVE COATING

[76] Inventor: Stephane Neuville, 14, rue de Saint-Soupplets, F-77230 Montge-en-Goele, France

[21] Appl. No.: 836,630

[22] PCT Filed: Nov. 6, 1995

[86] PCT No.: PCT/FR95/01455

§ 371 Date: Aug. 11, 1997

§ 102(e) Date: Aug. 11, 1997

[87] PCT Pub. No.: WO96/14448

PCT Pub. Date: May 17, 1996

[30] Foreign Application Priority Data

Nov. 7, 1994 [FR] France .................................. 94 13323

[51] Int. Cl.⁶ ............................ C23C 16/32; C23C 16/34
[52] U.S. Cl. ........................ 427/575; 427/576; 427/577; 427/249; 427/255.2; 204/192.12; 204/192.16
[58] Field of Search .................................. 427/575, 576, 427/577, 249, 255.2; 204/192.12, 192.16

[56] References Cited

U.S. PATENT DOCUMENTS

| 5,013,579 | 5/1991 | Yamazaki | 427/577 |
| 5,104,509 | 4/1992 | Buck et al. | 204/192.38 |
| 5,175,020 | 12/1992 | Doellein et al. | 427/569 |

FOREIGN PATENT DOCUMENTS

| 0 244 874 | 5/1987 | European Pat. Off. | C23C 14/06 |
| 0 284 190 | 2/1988 | European Pat. Off. | C23C 16/26 |
| 55-002715 | 10/1980 | Japan | C23C 11/08 |
| 60-75579 | 4/1985 | Japan | C23C 16/34 |
| 63-134661 | 7/1988 | Japan | C23C 16/34 |

OTHER PUBLICATIONS

International Search Report corresponding to PCT/FR95/01455 Feb. 1996.

7th International Conference on Thin Films, New Delhi, India, Dec. 7–11, 1987, Aiyer, C.R., et al., Effect of Mixing Oxygen or Diboran on the Formation of Amorphous Carbon Films From Methane by R.F. Plasma Chemical Vapour Deposition, pp. 229–232.

Diamonds and Related Materials, Feb. 1995, Switzerland, Vol. 4, No. 2, Kulikovsky, V. Yu, et al., "Preparation of Thin Hard Boron Nitride Films by R.F. Magnetron Sputtering", pp. 113–119.

4th European Conference on Diamond, Diamond–Like and Related Materials, Albufeira, Portugal, Sep. 20–24, 1993, vol. 3, No. 4–6, Dworschak, W., et al., Diamond and Related Materials, Apr., 1994, Switzerland, Growth of Cubic Boron Nitride Coatings in a Magnetic Field Enhanced R.F. Glow Discharge, pp. 338–340.

Le Vide, vol. 41, No. 230, Jan. 1, 1986, Paris, France, H. Michel, et al., Analyse De la Texture De Couches Minces Delitane Et De Nitrure De Titane Obtenues Par P.V.D., pp. 65–69.

Fifteenth IUPAP International Conference on Amorphous Semiconductors; Science and Technology, Cambridge, UK Sep. 6–10, 1993, Journal of Non–Crystalline Solids, Dec., 1993, Netherlands Amaratunga, G.A.J., et al., "Doping of Highly Tetrahedral Amorphous Carbon", pp. 1120–1121.

*Primary Examiner*—Shrive Beck
*Assistant Examiner*—Timothy Meeks
*Attorney, Agent, or Firm*—Baker & Daniels

[57] ABSTRACT

A method for depositing a hard protective coating on at least one part, wherein 10–70% of nitrogen combined with 10–70% of a mixture of helium and argon or 10–70% of neon for strongly exciting and dissociating the nitrogen and hydrogen, is added to a precursor gas, and the energy delivered to each atom of the precursor gas is selected so as to achieve so-called "Lifschitz" conditions which define the energy range in which a maximum number of diamond-like tetrahedral structures are produced instead of graphite structures.

13 Claims, No Drawings

METHOD FOR DEPOSITING A HARD PROTECTIVE COATING

The present invention concerns a method of depositing a very hard protective coating on at least one parts This coating can be a coating of the pseudo diamond-like amorphous carbon type based on carbon and nitrogen, or, alternatively, a titanium-based coating of the TIN or TiCN-type, or even boron nitride (BN) coating.

In all cases, these coatings should be sufficiently hard, heat-stable and adherent.

In order to increase the resistance to wear by friction or abrasion of mechanical parts, in particular those exposed to high stresses, or to protect them against corrosion, attempts have been made for several decades to find protective coatings, amongst which titanium nitride layers or layers obtained by nitridation can be mentioned, for example.

In spite of their intrinsic quality, such layers have not always proved totally satisfactory, particularly in the case of parts which are to withstand very high stresses, in particular mould parts, parts subject to mechanical wear, etc., in particular owing to insufficient adherence above all on the angular portions.

In order to overcome these problems, researchers have already proposed coatings of variable hardness of the so-called pseudo diamond-like amorphous carbon type, substantially containing carbon and hydrogen in variable proportions and, if necessary, doping agents such as silicon, nitrogen, fluorine, boron or metals such as titanium or silver.

Theme coatings, or similar coatings such as titanium carbide or nitride, boron carbide or nitride, etc. which have heat-stability varying between 400° C. and 10000° C., can be obtained by applying different techniques, amongst which the techniques derived from the technique known an CVD (Chemical Vapour Desposition) can be mentioned.

In the conventional CVD technique, a precursor gas containing in particular one or a plurality of hydrocarbons is introduced into a cheer containing the parts to be coated which are raised to a temperature of the order of 800° to 1500° C. At these temperatures, the gases introduced can react chemically with one another and bring about the formation of a thin solid layer which condenses on the hot parts.

With techniques derived from the conventional high-temperature CVD technique, so-called polycrystalline diamond-like carbon layers which have a tetrahedral structure largely similar to that of diamond and are substantially hydrogen-free (following the recombination and elimination of the hydrogen) can be deposited in the presence of an excess of dissociated hydrogen (in particular using a hot filament or in the presence of an electrical discharge produced at high pressure in which there is no ton bombardment), However, as concerns polycrystalline diamond-like carbon, this technique does not enable very adherent deposits to be produced, in particular owing to the presence of high thermal stresses, and it can only be used for hard materials or ceramics which can withstand temperatures of between 800° and 1500° C.

In order to generalize the use at this technique, specialists have developed the so-called "PECVD" (Plasma Enhanced Chemical Vapour Deposition) or "plasma-assisted CVD technique" in which the temperature can be decreased to a large extent.

Such a coating technique is used in a vacuum chamber associated with a pump system and containing a metal support connected to a high-power generator on which the parts to be coated are placed. The generator can deliver a direct or alternating current operating in the radio-frequency range (13.56 MHz) or the microwave range (2.45 GHz) in order to provide the interior of the chamber with the energy necessary for maintaining an electrical voltage discharge of the order of 10 to 1000 V, which, moreover, increases the temperature of the metal support and the part to be treated to a value of between 150° and 400° C. when the deposit is greater than 1 $\mu$m thick.

When this technique is applied, the vacuum chamber is brought beforehand to a pressure of the order of between $10^{-4}$ and $10^{-6}$ mbar and a precursor gas containing one or a plurality of hydrocarbons and, if necessary, doping agents is introduced at pressures of the order of between $5 \cdot 10^{-3}$ and 1 mbar; metering valves enable the respective amounts of gas introduced into the chamber to be regulated.

In the pressure and electrical power conditions prevailing inside the chamber, the precursor gas can thus be excited physically and chemically and ionized such that the atoms lose some of their electrons and are transformed into positive particles; a plasma then exists which is recognized by its specific glow. A consequence of this transformation is "cracking" of the gaseous mixture into elementary atoms and hydrocarbon-containing radicals which are deposited in the form of solid hydrogenated carbon on the part by ion bombardment; in this way a protective coating of the pseudo diamond-like amorphous carbon type can be obtained which is in fact formed by tho association of diamond-type tetrahedral structures, graphitic structures and structures corresponding to hydrogenated carbon.

More precisely, it is known that plasma consists of a mixture of neutral radicals which are not ionized but activated and positive ion particles which have lost their electrons. Owing to their very high chemical reactivity, the neutral radicals adhere-to the surface of the support and the part with a "bonding" coefficient of between 0.01 and 1 whilst the ion particles compact the resultant deposit.

Simultaneously with the above transformations, the metal support is itself negatively charged, as in the part to be coated, and consequently exerts an attraction on the positive ion particles in the plasma; these particles are thus accelerated in the direction of the par and the deposit is subjected to ion bombardment as it grows, This bombardment is a very important factor, in particular in view of the fact that, in a sphere of which the centre is the point of impact of each ion, the atoms present in the coating which is in the process of being formed are subjected to powerful shocks and very high pressures which compress them before expansion; this gives rise to atomic displacement which can help to produce a dense structure.

The above method-enables a thin layer of a coating of particularly hard and dense material to be deposited. However these coatings have a certain number of defects, including their thermal instability at temperatures above 400°–500° C., their low adherence and their fragility, leading in particular to risks of flaking.

Many researchers have attempted to overcome the above disadvantages, in particular by adding different types of doping agent to the precursor gas. Among the most promising attempts can be noted those described in FR-A-91 04 896 and FR-A-91 13 017 which propose adding to the carbon-containing gas compounds combined with silicon as well as boron and nitrogen, in particular in the form of a boronic and nitrogenous carbon-containing molecule having the same number of nitrogen and boron atoms.

However, these attempts have not achieved the desired success and consequently the PECVD technique for hydrogenated amorphous carbon was not developed on an industrial scale as might have been expected and currently these coatings have in general been abandoned in favour of titanium nitride-based coatings which are far less hard but give excellent results on cutting and stamping tools since their production and adherence can be controlled.

One of the objects of the present invention is to overcome these disadvantages by proposing a method enabling a protective coating of the pseudo diamond-like amorphous carbon type which is simultaneously hard, heat-stable and adherent to be deposited on a part using the PECVD technique.

In accordance with the inventions in order to devise this method it was decided to implement a known theory, the so-called "Liu and Cohen" theory, according to which it should be possible to obtain a $C_3N_4$ compound having a structure which is largely identical to that of $Si_3N_4$, whilst being harder than diamond. However hitherto nobody has succeeded in producing such a compound, in particular using the PECVD technique, In order to obtain such a compound, the carbon and nitrogen have to be made to react; however such a reaction proves extremely difficult to perform in view of the fact that the nitrogen has to be highly dissociated and furthermore it should not be able to compete with the hydrogen, which in theory excludes the use of a hydrocarbon-containing precursor gas and adding nitrogen thereto.

Nevertheless, the object of the invention is to devise a method enabling such a protective coating based on carbon and nitrogen to be deposited on at least one part using the PECVD techniques In order for ouch a coating to be satisfactory, it is essential that it has a predominantly diamond-like tetrahedral structure which is not polymeric, i.e. it should be hydrogen-free.

The presence of hydrogen in such a coating has four fundamental consequences which are all harmful, the hydrogenated elements implanted in the layers give rise to stresses the result of which is the bursting and delamination of these layers;

it has been observed that, when the conventional coatings based on pseudo diamond-like amorphous carbon are heated, hydrogen is released therefrom by thermodiffusion, resulting in graphitization of the layers;

the presence of hydrogen further contributes greatly to adherence problems; hydrogen is in fact a monovalent atom comprising two electrons; a terminal hydrogen therefore comprises a "dead" branch which cannot help to form interfacial covalent bonds; and hydrogen prevents the formation of non-hydrogenated tetrahedral sites which are the source of the hardness.

This harmful effect of hydrogen means that, in order to be satisfactory, a protective coating deposited by the PECVD technique must imperatively be hydrogen-free.

The invention therefore proposes a method enabling such a deposit of the pseudo diamond-like amorphous carbon type which is hard and dehydrogenated to be obtained, without having recourse to high-temperature plasma chemistry, a is the case with polycrystalline diamond-like carbon deposits.

In accordance with this method, a precursor gas containing one or a plurality of hydrocarbons and doping agents is introduced into a vacuum chamber containing a metal support connected to a high-power generator producing direct or alternating current and operating In the radio-frequency or microwave range and on which the part to be coated is placed, and an electrical discharge is maintained inside the chamber so as to increase the temperature of the part to a value of between 150° and 400° C. when the deposit is greater than 1 $\mu$m thick, and in power and pressure conditions enabling the precursor gas to be excited physically and chemically and ionized in the form of plasma so as to cause a protective coating of the pseudo diamond-like amorphous carbon type to be deposited on the part by ion bombardment.

According to the invention, this method is characterized in that added to the precursor gas first between 10 and 70% nitrogen combined with between 10 and 70% of a mixture of helium and/or argon or with between 10 and 70% neon of which the role in to greatly excite and dissociate the nitrogen and hydrogen and, secondly, between 0.5 and 5% boron acting as catalyst to separate the CH-type bonds so as to eliminate the hydrogen and make it easier for the C and N to bond; and in that the energy supplied to each precursor gas atom is selected so as to bring about so-called "Lifschitz" conditions, which define the energy range in which the maximum number of diamond-type tetrahedral structures are obtained at the expense of graphitic structures.

It should be noted that the adherence of such a deposit can be increased by using a pre-layer which improves the interfacial adherence energy, such as silicon carbide or dehydrogenated germanium carbide.

The essential parameter of the method according to the invention is associated with the addition to the precursor gas of a considerable proportion of rare gases which can consist either of a mixture of helium and argon or of neon.

It has been possible to establish that rare gases of this type can act according to three different mechanisms of which the first consists in increasing the mobility of the hydrogen atoms present on the surface of the part, so permitting their grouping together and the reconstitution of the $H_2$ molecules which can escape.

The second mechanism of the effect of these rare gases is to, encourage the dissociation of nitrogen and hydrogen following their bombardment. It is essential to note that in a plasma, helium can dissociate nitrogen to a very great degree but has no effect on hydrogen whilst, on the contrary and without knowing the underlying reason, argon dissociates hydrogen greatly but only dissociates nitrogen very slightly; neon, of which the molecular mass is half-way between that of helium and argon, enables nitrogen and hydrogen to be dissociated simultaneously in a plasmas it, could therefore be noted that it dissociates nitrogen better than argon and hydrogen better than helium.

The third mechanism of the effect of these rare gases is selective etching. According to this mechanism, atoms or radicals of the plasma can react and recombine with the species present on the surface of the part; by way of example, atomic hydrogen or nitrogen in the plasma can recombine with the hydrogen atoms on the surface of the part to release $H_2$ or NH, all the more go if boron is found in the vicinity of the hydrogenated bonds on the surface and acts as a catalyst for the recombination and restitution of the hydrogen.

A further essential parameter of the method according to the invention is associated with the injection of nitrogen into the precursor gas; it has been noted that it is essential to inject a sufficient amount of nitrogen to obtain $C-N_X$ bonds in relatively large amounts and to help obtain a tetrahedral structure (even if the final product may in fact comprise only a small amount of nitrogen (a few percent incorporated)) but that, conversely, the effect of adding too high an amount of nitrogen (of the order of 70 to 90%) to the precursor gas is to disintegrate the layer produced and bring about chemical disorders owing to the fact that the non-dissociated nitrogen does not bond completely with the carbon atoms and remains in the free state in the material.

More precisely, in a plasma into which nitrogen is injected the presence is noted, in addition to molecular nitrogen, of $N^+$, $N_2^+$ and N radicals, the latter being able to react by selective etching with the hydrogen atoms present on the support surface, such that it is advantageous for the plasma to contain the maximum amount of atomic nitrogen. However, the presence of nitrogen is at the same time not without its disadvantages, given that it causes $N_2^+$ particles to form which appear on the surface of the part and create unstable —N=N-type "pseudo molecules" there which are not highly bonded in a carbon environment and tend to be released under the effect of an increase in temperature, giving rise to graphitization. In order to obtain a sufficiently stable material It is therefore essential to prevent as far an possible the creation of such pseudo molecules and to encourage the formation of firmly connected C—$N_x$ bonds which, owing to the incorporation of nitrogen atoms in the structure, results in stabilization of the diamond-type tetrahedral bonds.

Schematically, this object can be achieved in two ways, i.e. either by encouraging the dissociation of the plasma such that it comprises the maximum number of simple atomic species to the detriment of the $N_2^+$ ions or by encouraging the selective etching of the pseudo molecules formed from these ions by the atomic hydrogen so as to destroy the (very weak) double bond between these molecules, so leading to the restitution of the NH.

This situation is largely able to prove the importance of the presence in the plasma both of highly dissociated hydrogen and nitrogen, in the presence of boron, and therefore of the addition to the precursor gas of rare gases which can permit such dissociation. This effect can be combined with the dissociation of the species prevent in the plasma, which dissociation is caused by injecting greater electrical power, in particular by using an additional plasma source produced by radio-frequency, DC or microwave discharge, but which may impair stability and the electrical conditions of the discharge.

The choice of the amount of boron added is likewise essential, given that too small an amount does not enable the desired expansion of the layers to be attained whilst too great an amount causes graphitization of the material which then becomes unusable A further essential parameter of the method according to the invention is the choice of energy supplied to each carbon atom of the precursor gas. It is in fact absolutely necessary to bring about the so-called "Lifschitz" conditions which define the energy range in which the maximum number of diamond-type tetrahedral structures are obtained. Outside this optimum range, i.e. If bombardment is too weak or too strong, a graphitic structure is obtained.

It will be appreciated that this optimum range depends on the hydrocarbon-containing gas used and is, for example, higher in the case of benzene than is the case of methane; however, according to a further feature of the invention it has been established that energy of between 100 and 150 eV should be supplied to each carbon atom of the precursor gas.

The implementation of the above method according to the invention has enabled parts to be obtained, in particular metal parts coated with a layer of non-hydrogenated nitrided amorphous carbon which is essentially distinguished by its high content of non-hydrogenated tetrahedral sites (more than 40%) and its high degree of hardness (600 to 8000 HV).

Pure diamond has 100% non-hydrogenated tetrahedral sites and its hardness is 10000 HV the hardness of polycrystalline diamond coatings in of the order of between 7000 and 800 H.

The coating obtained according to the invention is therefore harder than hydrogenated amorphous carbons, more heat-stable than these deposits and also more chemically stable owing to the tetrahedral sites' being stabilized by nitrogen, this coating is furthermore amorphous and it sliding coefficient is low and independent of the moisture content.

A part thus coated can, for example, be a cutting, blanking or shaping tool, parts of engines and hydraulic and mechanical systems, parts subject to wear in mechanisms, medical prostheses, etc.

According to a variant of the invention, it is possible to obtain part coated with largely similar layer using not the PECVD technique but the PVD (Physical Vapour Deposition) technique which may or may not be enhanced by a magnetic field (the so-called "magnetron" technique using a magnetic field or "diode sputtering" if a magnetic field is not used).

The invention further concerns a method of depositing on at least one part a protective coating of the pseudo diamond-like amorphous carbon type which is based on carbon and nitrogen and is substantially hydrogen-free, using the PVD technique which may or may not be enhanced by a magnetic field.

According to this method, a nitrogenous sputtering gas is introduced into a vacuum chamber containing a metal support connected to a high-power generator producing direct or alternating current and operating in the radio-frequency or microwave range and on which is placed the part to be coated by creating a discharge so as to physically and chemically excits the sputtering gas and ionize it in the form of plasma; and the surface of a graphite target located in the vacuum chamber and supplied with direct or radio-frequency current sputtered so as to cause a protective coating of the pseudo diamond-like amorphous carbon type to be deposited on the part.

Such a method therefore differs from the PECVD technique in that, instead of introducing into the chamber a hydrocarbon-containing precursor gas, a solid target, generally of graphite, is introduced thereinto; the species deposited on the part by ion bombardment are therefore not obtained chemically, as in the PECVD technique, but physically owing to the sputtering of a solid target.

It should be noted that researchers have already attempted to form C—$N_x$ bonds on the surface of a part using such a method. For example, it has already bean proposed to introduce argon into a nitrogen plasma,; the argon can thus dissociate the nitrogen somewhat so as to obtain nitrogen atoms which can bond with the sputtered carbon in order to form C—$N_x$ bonds. However, the structure of the resultant coating is not ideal since a high proportion of the nitrogen is not dissociated but transformed into $N_2^+$ particles, causing unstable —N=N-pseudo molecules of the above-mentioned type to form on the surface of the Part are with the consequent disadvantages.

The method according to the invention overcomes these disadvantages.

The method is characterized in that the gas for sputtering the graphite target contains between 5 and 40% nitrogen and between 5 and 40% hydrogen combined with between 0.5 and 5% boron and with between 10 and 70% of a mixture of helium and/or argon or with between 10 and 70% neon, of which the role is to greatly excite and dissociate the nitrogen and hydrogen; and in that the parameters of the current supplying the support bearing the part are selected so as to give rise to radio-frequency polarization of this support, bringing about so-called "Lifschitz" conditions which define the energy range in which the maximum number of diamond-type tetrahedral structures are obtained at the expense of graphitic structures.

Consequently, the above features and comments concerning the method according to the invention, which enable a protective coating of the pseudo diamond-like amorphous carbon type which is simultaneously hard heat-stable and adherent to be deposited on a part by the. PRCVD technique, can be adapted perfectly to a method of obtaining a highly similar coating using the PVD technique provided that traces of boron and hydrogen are added to the plasma; this hydrogen can then be greatly dissociated so as to selectively etch the —N═N- pseudo-molecules which may be present on the surface of the part. It will be appreciated that it is then essential to use radio-frequency polarization of the support bearing the part so as to bring about the "Lifechitz" conditions.

The PVD technique is in fact more costly than the PECVD technique and requires the use of more sophisticated equipment; it may nevertheless find areas of application such as, for example, the coating of the interior of magnetic discs or tubes or even flat screen production.

Specialists in plasma physics are also very aware that a volume of plasma is always surrounded by an area known as a "sheath" through which the ions are accelerated. Depending on the composition of the plasma so-called "collisional sheaths" can exist in which collision reactions occur, of which the consequence is the appearance of highly diverse energies, of which some correspond to the "Lifschitz" conditions whilst others do not, giving rise to a deposit which is not very hard and hydrogenated.

Therefore, according to a further feature of the invention, it is essential to select power and pressure conditions prevailing inside the vacuum chamber so as to create a plasma with a non-collisional sheath, enabling the energy range supplied to each of the precursor gas carbon atoms to be reduced It should further be noted that, according to the invention, the plasma can be excited by radio-frequency (13.56 MHz); however, it is advantageous to operate in the microwave range (2.45 GHz), i.e at lower pressures by using an "antenna curtain" or a microwave source with a long aperture it is possible to produce large reactors (of several square meters) and so enable the method to be carried out on a large scale.

According to a further feature of the invention, a pulsation can be superimposed in known manner on the current supplied by the generator such that the plasma is activated only during a cyclic fraction of the treatment time.

In particular, by activating the plasma for between 10 and 80% of the treatment time at a frequency of between 1 and 100 kHz, the temperature of the resultant coatings can be considerably reduced, firstly, by enabling the operation to be carried out at far greater power than that used conventionally, at practically identical average power levels of between 0.1 and 0.5 W/cm$^2$, and, secondly, by ensuring that the negative ions can leave the plasma and be deposited on the surfaces to be treated, which prevents the appearance of dust and improves the cohesion of the deposit and hence the adherence.

It should be noted that the addition of a large quantity of helium causes advanced dissociation of the $C_xH_y$ bonds, so enabling non-hydrogenated amorphous carbon deposits to be obtained.

However, when working at high pressure with sufficient $C_xH_y$ partial pressure to obtain an advantageous deposition rate, the sheathe are collisional and the "Lifschitz" conditions cannot be respected, so resulting in graphitization.

In the opposite instance, that is when working at low pressure, the deposition rate in inadequate In accordance with a second variant of the invention, it is possible to obtain very hard protective coatings based on titanium and nitrogen and carbon by using a method largely derived from the above-mentioned method of obtaining by the PECVD technique coatings of the pseudo diamond-like amorphous carbon type which are based on carbon and nitrogen and are essentially hydrogen-free.

Such coatings, of the TiN type, in which the nitrogen is very firmly bonded to the titanium, are at present widely used in numerous areas of industry; they can have degrees of hardness of up to 3500–4000 HV in practice but are, however, rarely used above 3000 HV in view of the high degree of internal stresses. It is known that the hardness of these coatings depends on the ionization of the plasma (the more the plasma is ionized, the more power is injected thereinto); however, as a consequence, the greater this hardness becomes, the higher the stresses, given that numerous elements can slip into the interstitial positions, Coatings of this type, which are heat-stable up to approximately 700° C. and decompose above this temperature, are conventionally manufactured by the PECVD and PVD techniques, using a precursor gas containing titanium and nitrogen or using a titanium or titanium nitride target.

However, when this method is carried out, the above-mentioned disadvantages are encountered, associated with the need, in order to obtain a TiN Coating of satisfactory texture, to have the maximum amount of atomic nitrogen available, therefore to dissociate to a very great extent the nitrogen introduced in the precursor gas and simultaneously to enable the —N═N-pseudo molecular groups which may be present on the surface of the part to be eliminated by selective etching by dissociated hydrogen atoms.

The present invention also overcomes this disadvantage.

To this end, the invention concerns a method of the above-mentioned type, characterized in that added to the precursor gas is between 10 and 70% hydrogen combined with between 0.5 and 5% boron and with between 10 and 70% of a mixture of helium and/or argon or with between 10 and 70% neon of which the role is to greatly excite and dissociate the nitrogen and hydrogen.

It should be noted that the boron used in this method is found again in an amount of a few percent in the deposit but does not significantly affect the structure thereof.

It is further known that TiN-type material obtained by the PECVD technique can be reinforced by adding one or a plurality of hydrocarbons to the precursor gas so an to obtain so-called TiCN coatings (in actual fact $Ti_xC_yN_z$) of the TiN-CN-TiC-type. Such coatings, which are harder but less adherent and less stable than coatings of the TiN type, can also be advantageously obtained by the above method according to the invention.

In this case, it should be ensured that the nitrogen is bonded to the titanium and also to the carbon so an to obtain a single "conglomerate" bonded to form a single network.

In accordance with the invention, very hard protective coatings of the TiN type, or if necessary of the TiCN type, which are highly similar to the above-mentioned coatings can also be obtained by applying a method derived from the PVD technique and selecting sputtering gas containing nitrogen, rare games and, if necessary, one or n plurality of hydrocarbons and by sputtering a titanium or titanium nitride target located in the vacuum chamber.

The invention also concerns such a method.

According to the invention, this method is characterized in that the target-sputtering gas contains between 10and 70% hydrogen combined with between 0.5 and 5% boron and with between 10 and 70% of a mixture of helium and/or argon or with between 10 and 70% neon of which the role La to greatly excite and dissociate the nitrogen and hydrogen.

It should be noted that, in accordance with this feature of the invention, the boron may be in the form of $B_2H_6$, $B(CH_3)_3$ or other nitro and/or carbo and/or hydro-boron compounds.

In conclusion, the method according to this second variant of the invention improves the texture of conventional TiN or TiCN-type coatings, whether they are obtained by the PECVD technique or the PVD technique, by increasing the dissociation of the nitrogen in the plasma and by being able to eliminate the —N=N-pseudo molecules which may ba present on the surface of the part by selective etching with atomic hydrogen.

It should be noted that for all titanium and nitrogen-based products, the choice of the optimum energy for ion bombardment depends on the nitrogen content* if there is an excess of nitrogen relative to the stoichiometric ratio, too great an energy level causes too high an increase of the interstitial nitrogen and consequently impairs the adherence of the deposits; on the contrary, if there is a lack of nitrogen relative to the stoichiometric ratio, the increase in the energy level enables the gaps to be filled, resulting in better cohesion and hardness of the material without increasing the stresses unnecessarily.

This situation explains the advantage in increasing the ionization and dissociation of the nitrogen owing to the presence of helium or neon.

This ionization and dissociation of the nitrogen are, of course, additional to ionization and dissociation following the infection of a greater electrical power, in particular using an additional plasma source brought about by radio-frequency, direct current or microwave discharge, provided that the stability of the discharge is not affected and the ion bombardment conditions are observed.

In accordance with a third variant of the inventions the above basic principles can likewise be adapted to the production of very hard BN-type protective coatings based on boron and nitrogen by using the PECVD or PVD technique.

Consequently, the invention also concerns a method enabling such deposits to be obtained by using one or other of the above-mentioned techniques.

It is known that, like carbon, boron nitride can be in the form of two phases a cubic phase (comparable to diamond) and a hexagonal phase (comparable to graphite), Cubic boron nitride is a very hard deposit of the order of 6000 HV which, although less hard than $CN_x$-type deposits, is far harder than hydrogenated amorphous carbon and has the advantage of being far more heat-stable (more than 1200° C.). Therefore, such deposits are also starting to be used, along with the above-mentioned deposits, not only for mechanical applications but also for optoelectronics, since these materials have a large electronic "gap" of the order of between 5 and 7 eV.

Moreover, research results show that the growth in these deposits, produced by the PECVD or PVD technique, from nitrogen and boron sources brings out the cubic structure when the ion bombardment energy is between 400 and 500 eV and the temperature is greater than 350° C. This is therefore a mechanism which can be likened to that of the "Lifschitz" conditions which apply for carbon.

Consequently, in accordance with the invention, the idea was conceived of encouraging the growth of a pure cubic phase by using means substantially similar to those used for carbon and nitrogen-based coatings, i.e. by increasing the proportion of atomic nitrogen in the plasma, therefore by encouraging the dissociation of the nitrogen introduced in the precursor gas or in the sputtering gas so as to have the maximum amount of atomic nitrogen available, and by allowing the —N=N-type pseudo molecules which might be present on the surface to be coated to big eliminated by selective etching using dissociated hydrogen.

Therefore the invention also concerns methods for depositing on at least one part a very hard BN-type protective coating based on boron and nitrogen respectively using the PECVD and PVD techniques.

When the PECVD technique is used, a precursor gas containing boron and hydrogen, in particular diborene or even boron chloride, trimethylboron and ammonia as well an nitrogen, is introduced into the vacuum chamber.

According to the invention, this method is characterized in that added to the precursor gas is between 10 and 70% hydrogen and between 10 and 70% of a mixture of helium and/or argon or between 10 and 70% neon of which the role is to greatly excite and dissociate the nitrogen and hydrogen; and in that the energy supplied to each atom of the precursor gas is selected so a as to bring about conditions which define the energy range in which the maximum number of diamond-type tetrahedral structures are obtained at the expense of graphitic structures, this energy being between 400 and 500 eV.

It should be noted that in the case in which boron chloride, trimethylboron and ammonia are used as precursor gas, the atomic hydrogen eliminates excess chlorine, carbon and hydrogen, However, by metering the dissociation of hydrogen, a fraction of carbon can be retained which is used to dope the material deposited and reduce its electronic gap.

Furthermore, it has been noted that, in order to respect the pseudo "Lifschitz" conditions, it is necessary to operate with a non-collisional plasma sheath, i.e. at less than 5 Pa total pressure.

Moreover, the total of the rare gases used should not exceed 30% of the total gaseous mixture, otherwise the sputtering by ion bombardment of these gases is too great and severely restricts the deposition rate, At the same time the partial pressure of the hydrogen should not exceed 70% otherwise insufficient precursor gas is available for ensuring the growth of the deposits.

When the PVD technique is used, a sputtering gas and a solid boron nitride target are introduced into the vacuum chamber.

According to the invention, this method is characterized in that the gas for sputtering the boron nitride target contains between 5 and 40% nitrogen and between 5 and 40% hydrogen combined with between 10 and 70% of a mixture of helium and/or argon or with between 10 and 70% neon, of which the role is to greatly excite and dissociate the nitrogen and hydrogen; and in that the parameters of the current supplying the support bearing the part are selected so as to give rise to radio-frequency polarization of this support, bringing about conditions which define the energy range in which the maximum number of diamond-type tetrahedral structures are obtained at the expense of graphitic structures.

When this method if carried out, the rare gases permit dissociation of the nitrogen, which is introduced to compensate the losses resulting from the selective sputtering of the nitrogen in the solid target, and the hydrogen, which is to a large extent dissociated by the nitrogen-hydrogen mixture, on the one hand, and the rare gases, on the other.

I claim:

1. Method of depositing on at least one part a protective coating which is substantially hydrogen-free, has a predominately tetrahedral structure and is based on carbon and nitrogen, on titanium, nitrogen, and carbon, or on boron and nitrogen, using plasma enhanced chemical vapor deposition by introducing a precursor gas containing elements to be deposited into a vacuum chamber containing a metal support connected to a power generator producing direct or alternating current and operating in the radio-frequency or microwave range and on which the part to be coated is placed, and maintaining an electrical discharge inside the chamber so as to increase the temperature of the part to a value of between 150° and 400° C., and at power and pressure conditions at which the precursor gas is excited physically and chemically and ionized in the form of plasma so as to cause said protective coating to be deposited on the part by ion bombardment, characterized in that the precursor gas contains nitrogen, a gas providing dissociated hydrogen within the plasma and boron or one of its compounds; in that added to the precursor gas is between 10 and 70% of a mixture of helium and argon or between 10 and 70% neon of which the role is to excite and dissociate the nitrogen and hydrogen simultaneously; and in that the energy supplied to each atom of the precursor gas is selected so that the coating possesses a maximum number of tetrahedral structures at the expense of hexagonal structures.

2. Method of depositing a protective coating according to claim 1, characterized in that the precursor gas contains between 10 and 70% nitrogen and one or a plurality of hydrocarbons acting as hydrogen-providing gas; and in that energy of between 100 and 150 eV is supplied to each carbon atom of said precursor gas.

3. Method of depositing a protective coating according to claim 1, characterized in that the precursor gas contains titanium, between 10 and 70% of hydrogen, and one or a plurality of hydrocarbons.

4. Method according to claim 1, characterized in that added to the precursor gas is between 0.5 and 5% boron acting as a catalyst to separate CH bonds so as to enable the hydrogen to be eliminated by recombining with atomic hydrogen and atomic nitrogen and to facilitate formation of CN bonds.

5. Method of depositing a protective coating according to claim 1, characterized in that the precursor gas contains between 10 and 70% hydrogen and said boron compound is selected from the group consisting of diborane, boron chloride, and trimethylboron.

6. Method according to claim 1, characterized in that the power and pressure conditions prevailing in the vacuum chamber are selected to produce a plasma with a non-collisional sheath.

7. Method according to claim 1, characterized in that said power generator operates in the microwave range.

8. Method according to claim 1, characterized in that pulsation is superimposed on the current supplied by the generator such that the plasma is activated only for a cyclic fraction of the treatment time.

9. Method of depositing on at least one part a protective coating which is substantially hydrogen-free, has a predominately tetrahedral structure and is based on carbon and nitrogen, on titanium, nitrogen and carbon or on boron and nitrogen, using physical vapor deposition which may or may not be enhanced by a magnetic field, by introducing a sputtering gas containing elements to be deposited into a vacuum chamber containing a metal support connected to a power generator producing direct or alternating current and operating in the radio-frequency or microwave range and on which is placed the part to be coated, creating an electrical discharge so as to physically and chemically excite the sputtering gas and ionize it in the form of plasma, providing a target which is made from a material containing elements to be deposited in the vacuum chamber and supplying said target with direct or radio-frequency current so as to cause said protective coating to be deposited on the part, characterized in that the sputtering gas contains nitrogen, a gas providing dissociated hydrogen within the plasma and boron or one of its compounds when boron is not present in the material constituting the target; in that added to the sputtering gas is between 10 and 70% of a mixture of helium and argon or between 10 and 70% neon of which the role is to excite and dissociate the nitrogen and hydrogen simultaneously; and in that the current supplying the support bearing the part is selected so as to give rise to radio-frequency polarization of the support, so that the coating possesses a maximum number of tetrahedral structures at the expense of hexagonal structures.

10. Method of depositing a protective coating according to claim 9, characterized in that a graphite target is sputtered; and in that the gas for sputtering said target contains between 5 and 40% nitrogen and between 5 and 40% hydrogen.

11. Method according to claim 10, characterized in that added to the sputtering gas is between 0.5 and 5% boron acting as a catalyst to separate CH bonds so as to enable hydrogen to be eliminated by recombination with atomic hydrogen and atomic nitrogen and to facilitate the formation of CN bonds.

12. Method of depositing a protective coating according to claim 9, characterized in that a titanium or titanium nitride target is sputtered; and in that the gas for sputtering said target contains between 10 and 70% of hydrogen, and one or a plurality of hydrocarbons.

13. Method of depositing a protective coating according to claim 9, characterized in that a solid boron nitride target is sputtered; and in that the gas for sputtering said target contains between 5 and 40% nitrogen and between 5 and 40% hydrogen.

* * * * *